United States Patent
Hirata et al.

(10) Patent No.: US 7,715,156 B2
(45) Date of Patent: May 11, 2010

(54) TUNNEL MAGNETORESISTIVE EFFECT ELEMENT AND THIN-FILM MAGNETIC HEAD WITH TUNNEL MAGNETORESISTIVE EFFECT READ HEAD ELEMENT

(75) Inventors: Kei Hirata, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 757 days.

(21) Appl. No.: 11/622,603

(22) Filed: Jan. 12, 2007

(65) Prior Publication Data

US 2008/0170337 A1 Jul. 17, 2008

(51) Int. Cl.
G11B 5/39 (2006.01)
G11B 5/127 (2006.01)

(52) U.S. Cl. .................. 360/324.2; 257/421; 428/811.1

(58) Field of Classification Search ...... 360/324–324.2; 257/421, 425, 427; 428/811.1
See application file for complete search history.

(56) References Cited

U.S. PATENT DOCUMENTS

| | | | |
|---|---|---|---|
| 6,760,201 B2 * | 7/2004 | Nakashio et al. ......... | 360/324.2 |
| 6,771,473 B2 | 8/2004 | Hiramoto et al. | |
| 7,042,686 B2 | 5/2006 | Hiramoto et al. | |
| 7,576,956 B2 * | 8/2009 | Huai ........................ | 360/324.2 |
| 7,602,000 B2 * | 10/2009 | Sun et al. .................... | 257/295 |
| 2002/0114112 A1 * | 8/2002 | Nakashio et al. ......... | 360/324.2 |
| 2003/0214762 A1 * | 11/2003 | Sharma et al. ........... | 360/324.2 |
| 2006/0018057 A1 * | 1/2006 | Huai ........................ | 360/324.2 |
| 2007/0070553 A1 * | 3/2007 | Tsunekawa et al. ......... | 360/313 |

FOREIGN PATENT DOCUMENTS

| JP | 2002-270921 A | 9/2002 |
|---|---|---|
| JP | 2003-008102 A | 1/2003 |
| JP | 2006-80116 A | 3/2006 |
| JP | 2006-93432 A | 4/2006 |

* cited by examiner

*Primary Examiner*—William J Klimowicz
(74) *Attorney, Agent, or Firm*—Frommer, Lawrence & Haug LLP

(57) ABSTRACT

A TMR element includes a lower electrode layer, a TMR multi-layer stacked on the lower electrode layer, and an upper electrode layer stacked on the TMR multi-layer. The TMR multi-layer includes a tunnel barrier layer having a three-layered structure of a first crystalline layer, a crystalline semiconductor layer and a second crystalline insulation layer stacked in this order.

29 Claims, 5 Drawing Sheets

TUNNEL MAGNETORESISTIVE EFFECT ELEMENT AND THIN-FILM MAGNETIC HEAD WITH TUNNEL MAGNETORESISTIVE EFFECT READ HEAD ELEMENT

BACKGROUND OF THE INVENTION

1. Field of the Invention

The present invention relates to a tunnel magnetoresistive effect (TMR) element for reading a signal representing a magnetic field intensity in a magnetic recording medium, to a thin-film magnetic head with the TMR read head element, and to a magnetic disk drive apparatus with the thin-film magnetic head.

2. Description of the Related Art

In order to satisfy the demand for higher recording density and downsizing in a hard disk drive (HDD) apparatus, higher sensitivity and larger output of a thin-film magnetic head are required. In order to meet this requirement, a thin-film magnetic head with a TMR read head element has been put to practical use.

In the thin-film magnetic head with such TMR read head element, it is necessary to decrease both resistance and capacitance of a read head circuit in order to be adaptive at high frequencies. Decreasing the resistance of the TMR read head element itself is effective to do this. This can easily be accomplished by reducing a thickness of a tunnel barrier layer.

However, the thin tunnel barrier layer causes problems as follows:

(1) the life of an element is reduced due to an increase in pin-holes in the tunnel barrier layer;

(2) a magnetic coupling between a magnetization fixed layer and a magnetization free layer in a TMR multiplayer increases causing an increase in noise at read output;

(3) it is difficult to control a process of fabricating a uniformly thin tunnel barrier layer; and (4) a magnetoresistive effect (MR) ratio decreases.

Therefore, it is necessary to reduce a sheet resistivity of the tunnel barrier layer without making it thin. In addition, it is required to maintain a high MR ratio.

U.S. Pat. Nos. 6,771,473 and 7,042,686 disclose a technique for realizing a low junction resistance and a high MR ratio. According to this technique, an intermediate layer containing at least three elements selected from Groups 2 to 17, which elements include at least one of F, O, N, C and B is used as a tunnel barrier layer.

SUMMARY OF THE INVENTION

It is therefore an object of the present invention to provide a TMR element with a new structure having a tunnel barrier layer for obtaining a low sheet resistivity without reducing its thickness, a thin-film magnetic head having the TMR read head element, and a magnetic disk drive apparatus including the thin-film magnetic head.

According to the present invention, the TMR element includes a lower electrode layer, a TMR multi-layer stacked on the lower electrode layer, and an upper electrode layer stacked on the TMR multi-layer. A tunnel barrier layer of the TMR multi-layer has a three-layered structure of a first crystalline insulation layer, a crystalline semiconductor layer and a second crystalline insulation layer stacked in this order.

Also, according to the present invention, the thin-film magnetic head includes a TMR read head element which includes a lower electrode layer, a TMR multi-layer stacked on the lower electrode layer, and an upper electrode layer stacked on this TMR multi-layer. A tunnel barrier layer of the TMR multi-layer has a three-layered structure of a first crystalline insulation layer, a crystalline semiconductor layer and a second crystalline insulation layer stacked in this order.

According to the present invention, further, a magnetic disk drive apparatus includes a magnetic disk, at least one thin-film magnetic head, and a support mechanism for supporting the at least one thin-film magnetic head so as to face a surface of the magnetic disk. The at least one thin-film magnetic head includes a TMR read head element having a lower electrode, a TMR multi-layer stacked on the lower electrode layer, and an upper electrode layer stacked on the TMR multi-layer. A tunnel barrier layer of the TMR multi-layer has a three-layered structure of a first crystalline insulation layer, a crystalline semiconductor layer and a second crystalline insulation layer stacked in this order.

The sheet resistivity RA can be reduced and a high MR ratio can be maintained while maintaining the thickness of the layer as is, due to the three-layered structure of the tunnel barrier layer where the first crystalline insulation layer, the crystalline semiconductor layer and the second crystalline insulation layer are stacked in this order.

It is preferred that the TMR multi-layer includes a magnetization fixed layer, a magnetization free layer and the above-described tunnel barrier layer which is stacked between the magnetization fixed layer and the magnetization free layer.

It is also preferred that the magnetization fixed layer includes a soft magnetic layer for magnetic pinning and an anti-ferromagnetic layer for magnetic pinning which is exchange-coupled to the soft magnetic layer for magnetic pinning.

It is further preferred that the crystalline semiconductor layer is made of an oxide semiconductor material. This oxide semiconductor material is any one of zinc oxide (ZnO), titanium oxide ($TiO_2$), chromium oxide ($CrO_2$), tantalum oxide ($Ta_2O_5$), indium oxide ($In_2O_3$), tin oxide ($SnO_2$) and iron oxide ($Fe_2O_3$) to which an impurity is added or not added.

It is also preferred that the crystalline insulation layer has a thickness in a range from 0.1 nm to 1.5 nm.

It is further preferred that the first crystalline insulation layer and the second crystalline insulation layer are made of a metal oxide material. This metal oxide material is preferably magnesium oxide (MgO).

It is also preferred that the first and second crystalline insulation layers have a total thickness in a range from 0.4 nm to 0.9 nm.

It is further preferred that the tunnel barrier layer has a thickness in a range from 0.9 nm to 2.4 nm.

It is also preferred that an inductive write head element is formed on the upper electrode layer of the TMR read head element.

Other objects and advantages of the present invention will become apparent from the following description of preferred embodiment of the present invention with reference to accompanying drawings.

DESCRIPTION OF THE PREFERRED EMBODIMENT

Figure 1:
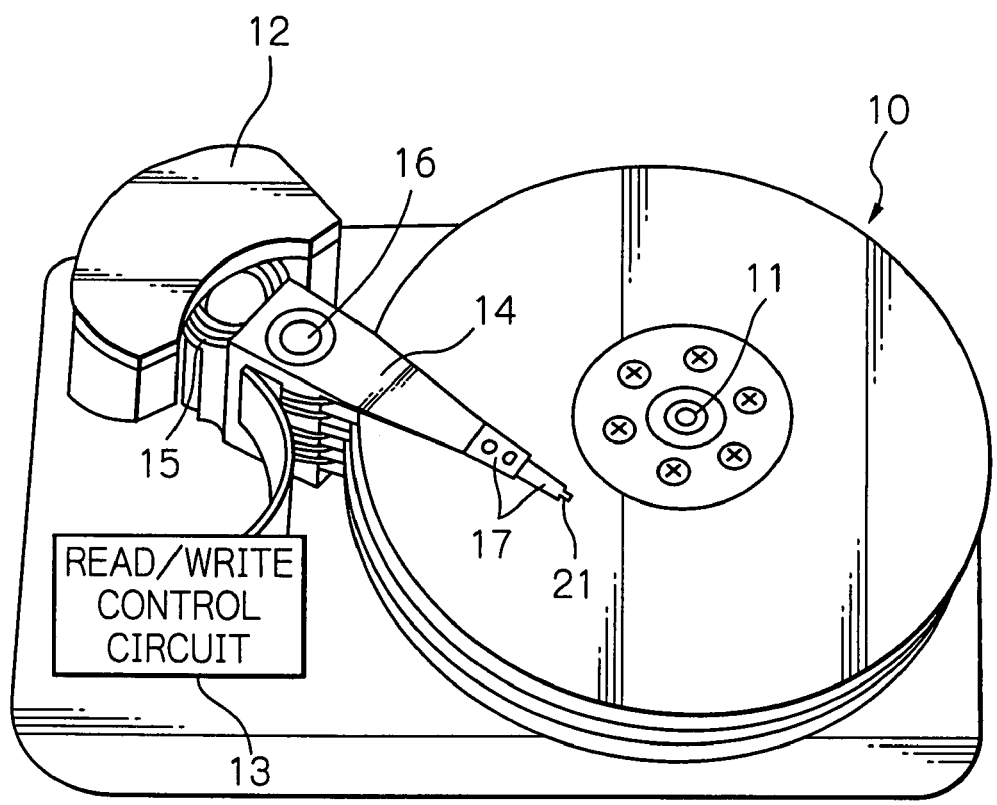
FIG. 1 is a perspective view schematically illustrating the main structure of a magnetic disk drive apparatus as an embodiment according to the present invention.
Figure 2:
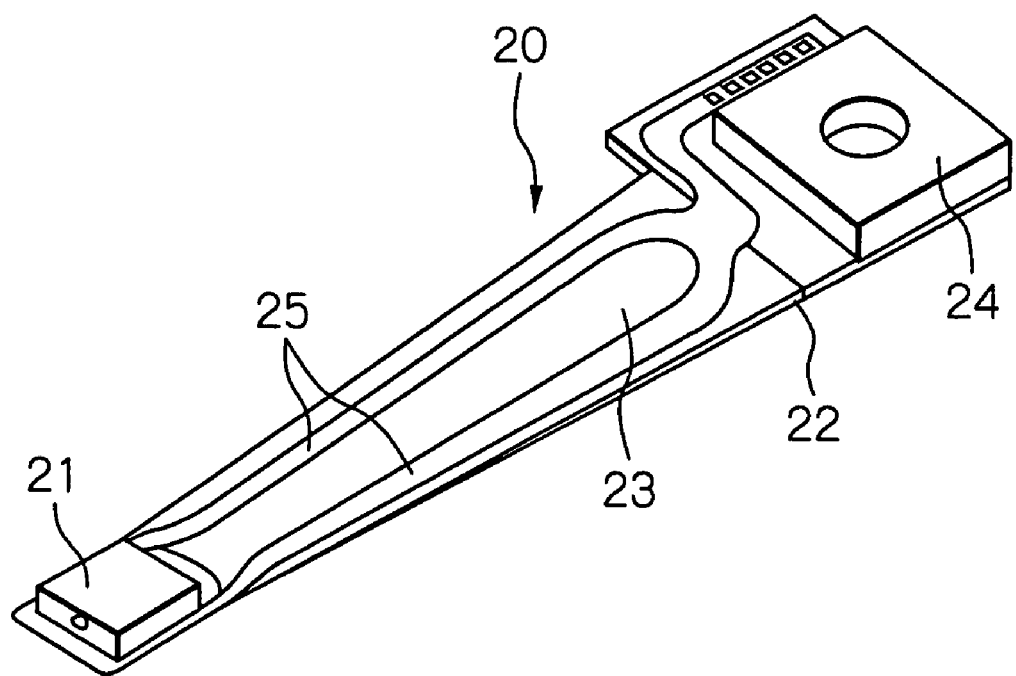
FIG. 2 is a perspective view illustrating an example of the structure of a head gimbal assembly (HGA) shown in FIG. 1.
Figure 3:
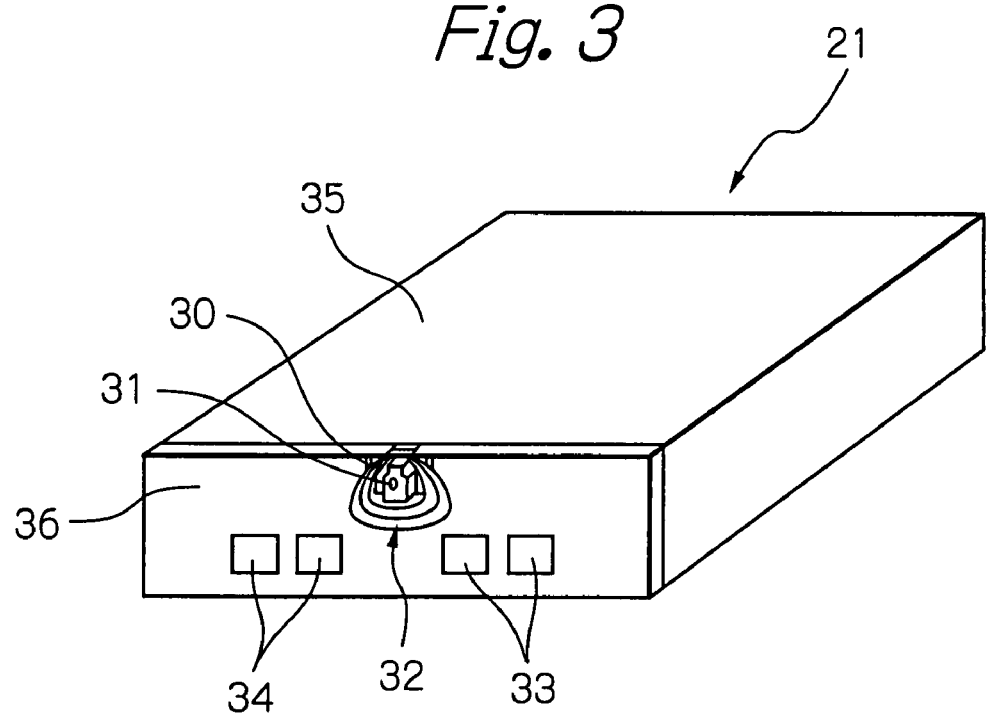
FIG. 3 is a perspective view illustrating a composite thin-film magnetic head mounted at the end of the HGA of FIG. 2.
Figure 4:
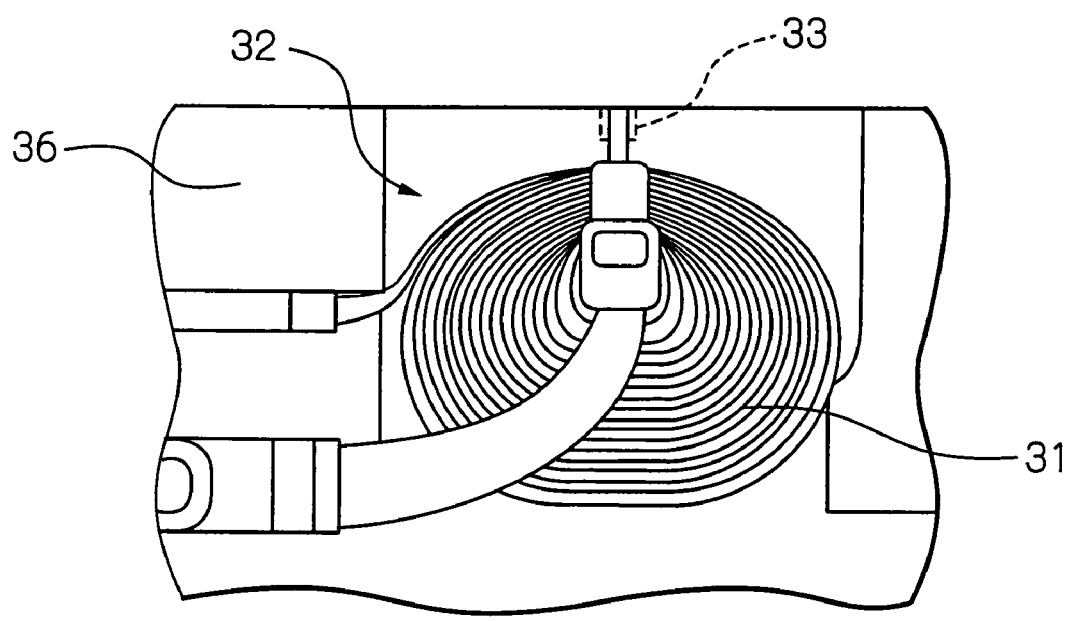
FIG. 4 is a plane view illustrating a magnetic head part of the composite thin-film magnetic head of FIG. 3, when viewed from an element forming surface side of a slider substrate.

FIG. 1 schematically illustrates the main structure of a magnetic disk drive apparatus according to an embodiment of the present invention. FIG. 2 illustrates an example of the structure of an HGA of FIG. 1. FIG. 3 illustrates the composite thin-film magnetic head mounted at the end of the HGA of FIG. 2. FIG. 4 illustrates the magnetic head element part of the composite thin-film magnetic head of FIG. 3, when viewed from an element forming surface side of a slider substrate.

In FIG. 1, a reference numeral 10 denotes a plurality of magnetic disks that rotates about the rotary axis of a spindle motor 11, 12 denotes an assembly carriage device for positioning the composite thin-film magnetic head or magnetic head slider on the track, and 13 denotes a read/write control circuit for controlling the read/write operation of the thin-film magnetic head, respectively.

The assembly carriage device 12 includes a plurality of drive arms 14. The drive arms 14 are swingable about a pivot-bearing axis 16 by a voice coil motor (VCM) 15, and are stacked in a direction along this axis 16. Each of the drive arms 14 has an HGA 17 mounted at the end thereof. The HGA 17 includes a magnetic head slider 21 facing the surface of each magnetic disk 10. In modifications, the magnetic disk drive apparatus may include only a single magnetic disk 10, drive arm 14 and HGA 17.

As shown in FIG. 2, in the HGA, the magnetic head slider 21 is fixed onto the end of a suspension 20. The magnetic head slider 21 has a TMR read head element and an inductive write head element. Further, a terminal electrode of the magnetic head slider 21 is electrically connected to an end of a wiring member 25.

The suspension 20 includes mainly a load beam 22, a flexure 23, a base plate 24 and the wiring member 25. The load beam 22 generates a load to be applied to the magnetic head slider 21. The flexure 23 having elasticity is fixed onto and supported by the load beam 22. The base plate 24 is arranged on the base of the load beam 22. The wiring member 25 is arranged on the flexure 23 and the load beam 22, and includes lead conductors and connection pads electrically connected to both ends of the lead conductors.

It is obvious that the structure of the suspension according to the present invention is not limited to the above. Though not illustrated, a head drive IC chip may be mounted in the middle of the suspension 20.

As shown in FIGS. 3 and 4, the magnetic head slider 21 of this embodiment includes a composite thin-film magnetic head 32 and four signal terminal electrodes 33 and 34, on an element formed surface 36 that is one side surface when an air bearing surface (ABS) 35 of the magnetic head slider serves as the bottom surface. The composite thin-film magnetic head 32 includes a TMR read head element 30 and an inductive write head element 31 that are mutually stacked. The four signal terminal electrodes 33 and 34 are connected to the TMR read head element 30 and the inductive write head element 31. The positions of these terminal electrodes are not limited to those shown in FIG. 3.

Figure 5:
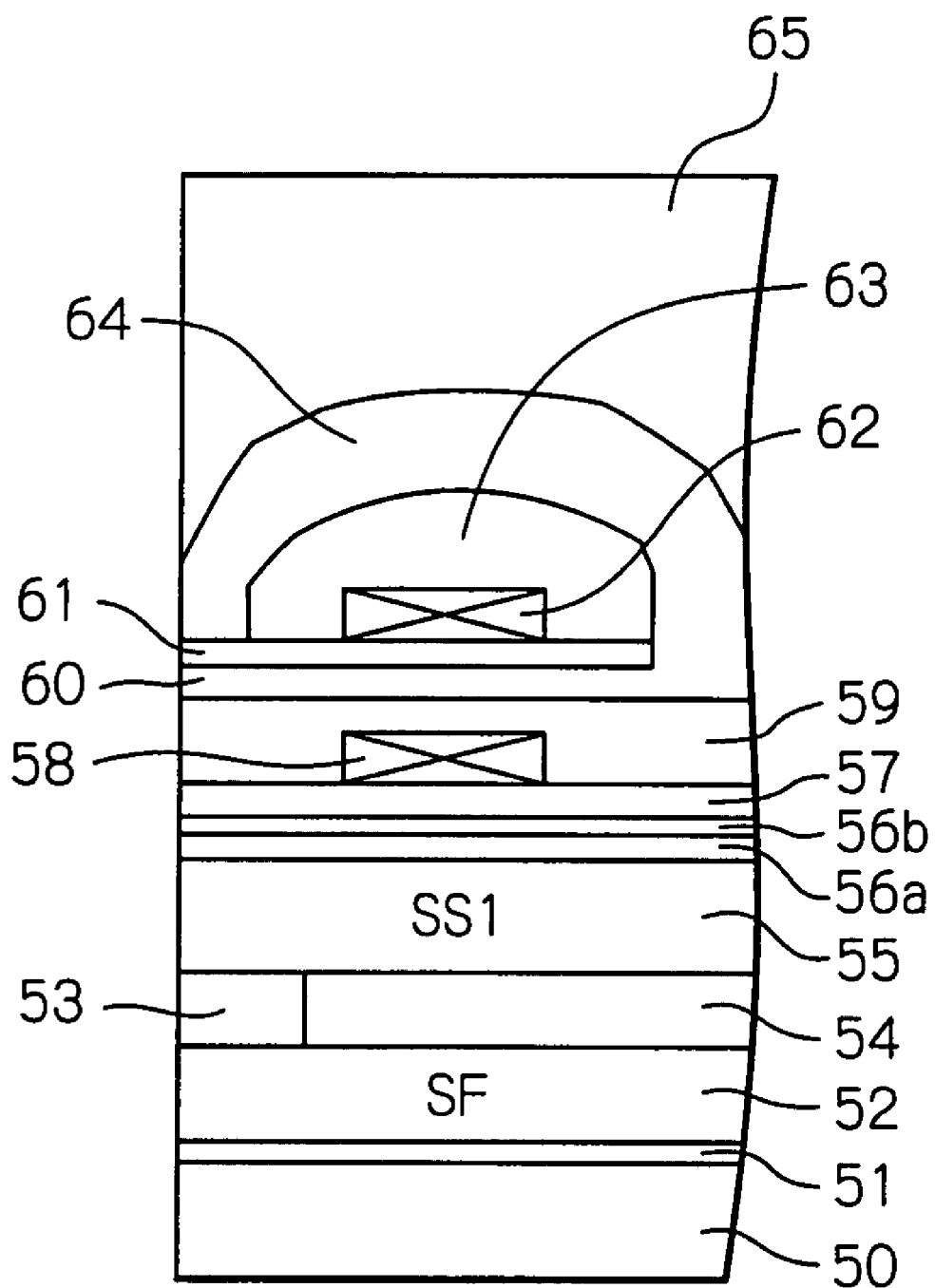
FIG. 5 is a central cross sectional view schematically illustrating the structure of the composite thin-film magnetic head of FIG. 3.
Figure 6:
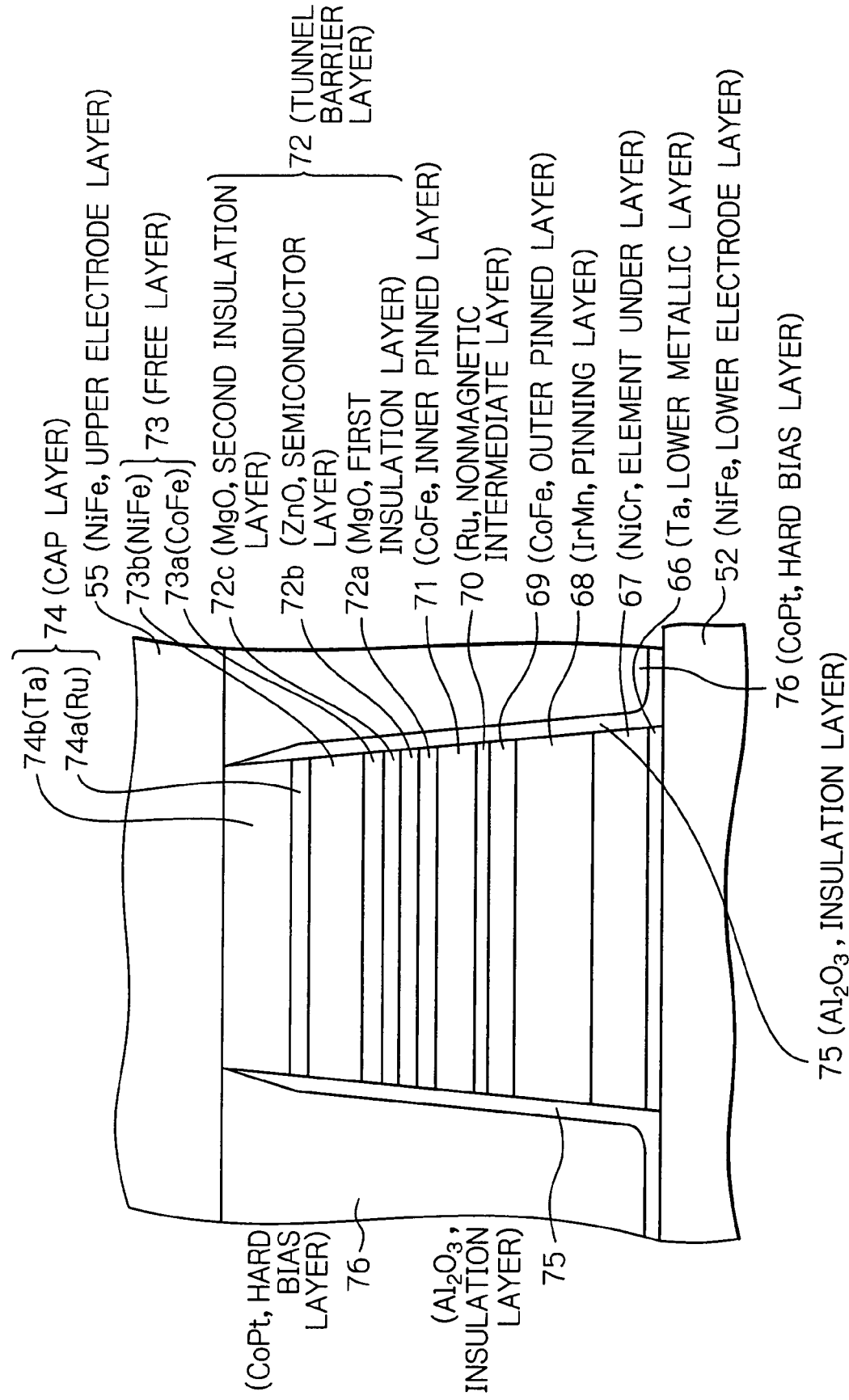
FIG. 6 is a cross sectional view schematically illustrating the structure of a TMR read head element part of the composite thin-film magnetic head of FIG. 3.

FIG. 5 schematically illustrates the structure of the composite thin-film magnetic head according to this embodiment. FIG. 6 schematically illustrates the structure of the TMR read head element part of the composite thin-film magnetic head. FIG. 5 shows a cross sectional view in a plane that is perpendicular to the ABS of the composite thin-film magnetic head and also perpendicular to the track width direction. FIG. 6 shows a cross sectional view in a plane parallel to the ABS. In this embodiment, the MR read head element consists of a TMR read head element, and the inductive write head element consists of a write head element with a perpendicular magnetic recording structure. However, the inductive write head element may be a write head element with a plane or horizontal magnetic recording structure.

The ABS 35 facing the surface of the magnetic disk is formed on a slider substrate 50 made of a conductive material, such as AlTiC, $Al_2O_3$—TiC (see FIG. 3). In operation, the magnetic head slider 21 hydrodynamically flies above the rotating magnetic disk with a predetermined flying height. An under insulation layer 51 is stacked on the element forming surface 36 of the slider substrate 50. This layer 51 is made of an insulating material, such as alumina ($Al_2O_3$) or silicon oxide ($SiO_2$), with a thickness of about 0.05 to 10 μm. A lower electrode layer 52 is stacked on the under insulation layer 51. This layer 52 can serve also as a lower shield layer (SF) made of a metal magnetic material, such as iron aluminum silicon (FeAlSi), nickel iron (NiFe), cobalt iron (CoFe), nickel iron cobalt (NiFeCo), iron nitride (FeN), iron zirconium nitride (FeZrN), iron tantalum nitride (FeTaN), cobalt zirconium niobium (CoZrNb) or cobalt zirconium tantalum (CoZrTa). A TMR multi-layer 53 and an insulation layer 54 made of an insulating material, such as $Al_2O_3$ or $SiO_2$ are stacked on the lower electrode layer 52.

The TMR multi-layer 53 has a multi-layered structure of a magnetization fixed layer consisting of a pinned layer and a pinning layer made of an anti-ferromagnetic material, a tunnel barrier layer, and a magnetization free layer (free layer). A magnetic domain control layer (not shown in FIG. 5) and the like for controlling the magnetic domain of the free layer is formed on the side surfaces of the TMR multi-layer 53.

An upper electrode layer 55 is formed on the TMR multi-layer 53 and the insulation layer 54, and serves also as an upper shield layer (SS1) made of a metallic magnetic material, such as FeAlSi, NiFe, CoFe, NiFeCo, FeN, FeZrN, FeTaN, CoZrNb, or CoZrTa.

The TMR read head element is basically composed of the lower electrode layer 52, the TMR multi-layer 53, the insulation layer 54, the upper electrode layer 55 and the magnetic domain control layer. The structure of the TMR read head element will more specifically be described later with reference to FIG. 6.

An inductive write head element is formed on the TMR read head element through an insulation layer 56a and a soft magnetic layer 56b. The inductive write head element includes an insulation layer 57, a backing coil layer 58, a backing coil insulation layer 59, a main magnetic pole layer 60, an insulation gap layer 61, a write coil layer 62, a write coil insulation layer 63 and an auxiliary magnetic pole layer 64. The insulation layer 57 is made of an insulating material, such as $Al_2O_3$ or $SiO_2$. The backing coil layer 58 is made of a conductive material, such as copper (Cu), etc. The backing coil insulation layer 59 is made, for example, of a heat-cured resist of novolac type. The main magnetic pole layer 60 is formed of a single layer film of a metallic magnetic material, such as FeAlSi, NiFe, CoFe, NiFeCo, FeN, FeZrN, FeTaN, CoZrNb or CoZrTa, or formed of a multi-layer film of any of these materials. The insulation gap layer 61 is made of an insulating material, such as $Al_2O_3$ or $SiO_2$. The write coil layer 62 is made of a conductive material, such as Cu. The insulation layer 63 is made, for example, of a heat-cured resist of novolac type. The auxiliary magnetic pole layer 64 is formed of a single layer film of a metallic magnetic material, such as FeAlSi, NiFe, CoFe, NiFeCo, FeN, FeZrN, FeTaN, CoZrNb or CoZrTa, or formed of a multi-layer film of any of these materials. A protective layer 65 made of $Al_2O_3$ or $SiO_2$, etc. is arranged on the inductive write head element.

The structure of the TMR read head element according to this embodiment will now be described with reference to FIG. 6. In this illustration, for the sake of clarity in the description, names and exemplary materials (but not limited to) of the layers follow corresponding reference numerals.

A lower metallic layer 66 and an element under layer 67 are stacked on the lower electrode layer 52 in the order described. The lower metallic layer 66 is made, for example, of Ta with a thickness of approximately 1 to 6 nm. The element under layer 67 is made, for example, of nickel chromium (NiCr), NiFe, nickel iron chromium (NiFeCr) or ruthenium (Ru) with a thickness of approximately 6 nm. An anti-ferromagnetic layer (pinning layer) 68 made of a manganese (Mn) alloy, such as iridium manganese (IrMn), platinum manganese (PtMn), palladium platinum manganese (PdPtMn), iron manganese (FeMn), nickel manganese (NiMn), ruthenium rhodium manganese (RuRhMn), rhodium manganese (RhMn) or chromium manganese platinum (CrMnPt) with a thickness of about 5 to 15 nm, preferably approximately 7 nm is stacked on the element under layer 67.

A synthetic pinned layer is stacked on the anti-ferromagnetic layer 68. This pinned layer consists of an outer pinned layer 69, a nonmagnetic intermediate layer 70 and an inner pinned layer 71 sequentially stacked. The outer pinned layer 69 is made, for example, of CoFe with a thickness of about 3.0 nm. The nonmagnetic intermediate layer 70 is made, for example, of Ru with a thickness of about 0.8 mm. The inner pinned layer 71 is made, for example, of CoFe, cobalt iron silicon (CoFeSi), cobalt manganese germanium (CoMnGe), cobalt manganese silicon (CoMnSi) or cobalt manganese aluminum (CoMnAl) with a thickness of approximately 1 to 3 nm. In the synthetic pinned layer, the magnetic moment of the outer pinned layer 69 and the inner pinned layer 71 is mutually cancelled so as to suppress the leakage magnetic field as a whole, and the magnetization direction of the inner pinned layer 71 is securely fixed as a result of anti-ferromagnetic coupling with the outer pinned layer 69. The magnetization direction of the outer pinned layer 69 is fixed due to anti-ferromagnetic coupling with the anti-ferromagnetic layer 68.

A tunnel barrier layer 72 is stacked on the inner pinned layer 71. In this embodiment, the tunnel barrier layer 72 has a three-layered structure of a first crystalline insulation layer 72a, a crystalline semiconductor layer 72b and a second crystalline insulation layer 72c.

The first crystalline insulation layer 72a and the second crystalline insulation layer 72c are both made of a crystalline metal-oxide material, such as MgO with a total thickness preferably in a range from 0.4 nm to 0.9 nm. The crystalline semiconductor layer 72b is preferably made of any one type of crystalline oxide semiconductor material among ZnO, $TiO_2$, $CrO_2$, $Ta_2O_5$, $In_2O_3$, $SnO_2$ and $Fe_2O_3$, or made of an n-type or p-type semiconductor material containing an impurity, which is added to the semiconductor material to form a donor or an acceptor, with a thickness preferably in a range from 0.1 nm to 1.5 nm. The impurity may, for example, be gallium oxide ($Ga_2O_5$), $In_2O_3$, $Al_2O_3$, MgO or boron oxide (BO).

Due to the crystalline material of each layer of the three-layered structure, spin polarized electrons coherently tunnel without the loss of spin information. Also, an adequate impurity is doped to the semiconductor material, thereby easily adjusting the sheet resistivity RA.

A high-polarizability film 73a and a soft magnetic film 73b are stacked on the tunnel barrier layer 72 in this order. The high-polarizability film 73a is made, for example, of CoFe with a thickness of approximately 1 nm, while the soft magnetic film 73b is made, for example, of NiFe with a thickness in a range from 2 nm to 6 nm. These films 73a and 73b form a magnetization free layer (free layer) 73 having a two-layered structure. Other than the above materials, the free layer 73 may be made of a ferromagnetic alloy material, such as Fe, Co, Ni, CoFe, NiFe, NiFeCo, CoFeB or cobalt iron nickel boron (CoFeNiB).

A cap layer 74 consisting of layers 74a and 74b is stacked on the free layer 73. The layer 74a is made, for example, of Ru with a thickness of approximately 1 nm, while the layer 74b is made, for example, of Ta with a thickness of approximately 5 nm. Other than the above materials, the cap layer 74 may be made of any of Rh, Pd, silver (Ag), iridium (Ir), Pt, gold (Au) and Mg, or an alloy of these.

The upper electrode layer 55 is stacked on the cap layer 74.

A hard bias layer 76 made of a hard magnetic material, such as CoPt is formed on the both sides of the TMR multi-layer in the track width direction through insulation layers 75 of for example $Al_2O_3$ or $SiO_2$. This hard bias layer 76 is used for applying a bias magnetic field for magnetic domain control to the free layer 73. In place of the hard bias layer, a stacked structure of a hard magnetic layer and an anti-ferromagnetic layer may be provided.

As explained above, in this embodiment, the tunnel barrier layer 72 has a three-layered structure of the first crystalline insulation layer 72a, the crystalline semiconductor layer 72b and the second crystalline insulation layer 72c, stacked in this order. Due to this structure, the sheet resistivity RA can be decreased while maintaining the film thickness, and also a high MR ratio can be maintained.

A plurality of samples of the tunnel barrier layer having a three-layered structure with layers of different thicknesses are prepared. Then, the sheet resistivity RA, MR ratio and interlayer coupling magnetic field Hin are measured. In this case, a MgO layer is used as the first crystalline insulation layer 72a and the second crystalline insulation layer 72c, while a ZnO layer is used as the crystalline semiconductor layer 72b. Tables 1 to 3 show the results.

Note that the interlayer coupling magnetic field Hin is an index indicating a magnetic coupling degree between the inner pinned layer 71 and the free layer 73. The value of the interlayer coupling magnetic field Hin is high when the free layer is highly effected by the pinned layer. The value of this interlayer coupling magnetic field Hin is preferably low.

In general, the sheet resistivity RA is required to be in a range from 0.3 $\Omega\mu m^2$ to 5.0 $\Omega\mu m^2$. If the sheet resistivity RA is lower than 0.3 $\Omega\mu m^2$, the insulation of the tunnel barrier layer is deteriorated. This may result in a reduction in the life of the element. If the sheet resistivity RA is greater than 5.0 $\Omega\mu m^2$, the element resistance becomes too high. As a result, the head SN ratio may possibly be decreased at high frequencies, and then a preamplifier outputs may possibly be saturated.

In general, it is required that the MR ratio be 30% or more. If the MR ratio is lower than 30%, sufficient head outputs cannot be obtained, in the case of a small element size. As a result, there is the possibility of a decrease in the head SN ratio.

Table 1 shows the dependence of the sheet resistivity RA, MR ratio and interlayer coupling magnetic field Hin, on the thickness of the ZnO layer.

TABLE 1

| | Thickness of First MgO Layer (nm) | Thickness of ZnO Layer (nm) | Thickness of Second MgO Layer (nm) | Total Thickness of Tunnel Barrier Layer (nm) | Sheet Resistivity RA ($\Omega\mu m^2$) | MR Ratio (%) | Interlayer Coupling Magnetic Field Hin (Oe) |
|---|---|---|---|---|---|---|---|
| Sample 1 | 0.8 | 0 | 0 | 0.8 | 1.90 | 55 | 30 |
| Sample 2 | 1.5 | 0 | 0 | 1.5 | 6.50 | 75 | 6 |
| Sample 3 | 2.4 | 0 | 0 | 2.4 | 14.50 | 80 | 8 |
| Sample 4 | 0.5 | 0.1 | 0.4 | 1.0 | 1.95 | 54 | 15 |
| Sample 5 | 0.5 | 0.2 | 0.4 | 1.1 | 1.98 | 52 | 9 |
| Sample 6 | 0.5 | 0.5 | 0.4 | 1.4 | 2.50 | 50 | 7 |
| Sample 7 | 0.5 | 0.8 | 0.4 | 1.7 | 3.40 | 45 | 9 |
| Sample 8 | 0.3 | 1.2 | 0.3 | 1.8 | 1.50 | 38 | 10 |
| Sample 9 | 0.3 | 1.5 | 0.3 | 2.1 | 2.40 | 34 | 8 |
| Sample 10 | 0.5 | 1.5 | 0.4 | 2.4 | 5.00 | 31 | 10 |
| Sample 11 | 0.5 | 1.7 | 0.4 | 2.6 | 5.50 | 25 | 9 |
| Sample 12 | 0.5 | 2.0 | 0.4 | 2.9 | 6.25 | 18 | 7 |

In samples 1 to 3, the tunnel barrier layer is formed of a single MgO layer. Sample 1 is not desirable, because Hin is too high. Samples 2 and 3 are not desirable, because their RA is greater than 5.0 $\Omega\mu m^2$.

In samples 4 to 12, the tunnel barrier layer has a three-layered structure of a MgO layer/ZnO layer/MgO layer. In samples 4 to 10, RA is 5.0 $\Omega\mu m^2$ or less, the MR ratio is 31% or more, and Hin is 15 Oe or less. Thus, their thickness is in a desirable range. In samples 11 and 12, RA is greater than 5.0 $\Omega\mu m^2$, and the MR ratio is lower than 30%. Thus, samples 11 and 12 are not desirable samples.

Therefore, the thickness of the ZnO layer is desirably in a range from 0.1 nm to 1.5 nm.

Table 2 shows the dependence of the sheet resistivity RA, MR ratio and interlayer coupling magnetic field Hin, on the total thickness of the first MgO layer and the second MgO layer. In samples of Table 2, the tunnel barrier layer has a three-layered structure of a MgO layer/ZnO layer/MgO layer.

TABLE 2

| | Thickness of First MgO Layer (nm) | Thickness of ZnO Layer (nm) | Thickness of Second MgO Layer (nm) | Total Thickness of Tunnel Barrier Layer (nm) | Sheet Resistivity RA ($\Omega\mu m^2$) | MR Ratio (%) | Interlayer Coupling Magnetic Field Hin (Oe) |
|---|---|---|---|---|---|---|---|
| Sample 13 | 0.1 | 1.5 | 0.1 | 1.7 | 1.85 | 29 | 9 |
| Sample 14 | 0.2 | 1.5 | 0.2 | 1.9 | 1.92 | 32 | 9 |
| Sample 9 | 0.3 | 1.5 | 0.3 | 2.1 | 2.40 | 34 | 8 |
| Sample 15 | 0.5 | 1.5 | 0.4 | 2.4 | 5.00 | 50 | 7 |
| Sample 16 | 0.6 | 1.5 | 0.4 | 2.5 | 6.50 | 55 | 8 |

Sample 13 is not desirable, because the MR ratio is lower than 30%. Sample 16 is not desirable, because RA is greater than 5.0 $\Omega\mu m^2$.

Samples 14, 9 and 15 have a desirable thickness, because RA is 5.0 $\Omega\mu m^2$ or less, the MR ratio is 32% or more and Hin is 9 Oe or less.

Therefore, the total thickness of the first MgO layer and the second MgO layer is preferably in a range from 0.4 nm to 0.9 nm.

Table 3 shows the dependence of the sheet resistivity RA, MR ratio and interlayer coupling magnetic field Hin, on the total thickness of the tunnel barrier layer. In samples of Table 3, the tunnel barrier layer has a three-layered structure of a MgO layer/ZnO layer/MgO layer.

TABLE 3

|  | Thickness of First MgO Layer (nm) | Thickness of ZnO Layer (nm) | Thickness of Second MgO Layer (nm) | Total Thickness of Tunnel Barrier Layer (nm) | Sheet Resistivity RA ($\Omega\mu m^2$) | MR Ratio (%) | Interlayer Coupling Magnetic Field Hin (Oe) |
|---|---|---|---|---|---|---|---|
| Sample 17 | 0.2 | 0.5 | 0.1 | 0.8 | 0.25 | 16 | 28 |
| Sample 18 | 0.2 | 0.5 | 0.2 | 0.9 | 0.40 | 30 | 13 |
| Sample 4 | 0.5 | 0.1 | 0.4 | 1.0 | 1.95 | 54 | 15 |
| Sample 5 | 0.5 | 0.2 | 0.4 | 1.1 | 1.98 | 52 | 9 |
| Sample 6 | 0.5 | 0.5 | 0.4 | 1.4 | 2.50 | 50 | 7 |
| Sample 7 | 0.5 | 0.8 | 0.4 | 1.7 | 3.40 | 45 | 9 |
| Sample 8 | 0.3 | 1.2 | 0.3 | 1.8 | 1.50 | 38 | 10 |
| Sample 9 | 0.3 | 1.5 | 0.3 | 2.1 | 2.40 | 34 | 8 |
| Sample 10 | 0.5 | 1.5 | 0.4 | 2.4 | 5.00 | 31 | 10 |
| Sample 11 | 0.5 | 1.7 | 0.4 | 2.6 | 5.50 | 25 | 9 |
| Sample 12 | 0.5 | 2.0 | 0.4 | 2.9 | 6.25 | 18 | 7 |

Sample 17 is not desirable, because the MR ratio is lower than 30% and Hin is quite high. Samples 11 and 12 are not desirable, because RA is greater than 5.0 $\Omega\mu m^2$ and the MR ratio is lower than 30%.

Samples 18 and 4 to 10 have a desirable thickness, because RA is 5.0 $\Omega\mu m^2$ or less, the MR ratio is 30% or more and Hin is 15 Oe or less.

Therefore, the thickness of the tunnel barrier layer is preferably in a range from 0.9 nm to 2.4 nm.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A tunnel magnetoresistive effect element including a lower electrode layer, a tunnel magnetoresistive effect multi-layer stacked on said lower electrode layer and provided with a tunnel barrier layer, and an upper electrode layer stacked on said tunnel magnetoresistive effect multi-layer,
said tunnel barrier layer of the tunnel magnetoresistive effect multi-layer comprising:
a three-layered structure of a first crystalline insulation layer, a crystalline semiconductor layer and a second crystalline insulation layer stacked in this order.

2. The tunnel magnetoresistive effect element as claimed in claim 1, wherein said tunnel magnetoresistive effect multi-layer comprises a magnetization fixed layer, a magnetization free layer, and said tunnel barrier layer stacked between said magnetization fixed layer and said magnetization free layer.

3. The tunnel magnetoresistive effect element as claimed in claim 2, wherein said magnetization fixed layer comprises a soft magnetic layer, and an anti-ferromagnetic layer exchange-coupled to said soft magnetic layer.

4. The tunnel magnetoresistive effect element as claimed in claim 1, wherein said crystalline semiconductor layer is made of an oxide semiconductor material.

5. The tunnel magnetoresistive effect element as claimed in claim 4, wherein said oxide semiconductor material is any one of zinc oxide, titanium oxide, chromium oxide, tantalum oxide, indium oxide, tin oxide and iron oxide, to which an impurity is added or not added.

6. The tunnel magnetoresistive effect element as claimed in claim 1, wherein said crystalline semiconductor layer has a thickness in a range from 0.1 nm to 1.5 nm.

7. The tunnel magnetoresistive effect element as claimed in claim 1, wherein said first crystalline insulation layer and said second crystalline insulation layer are made of a metal oxide material.

8. The tunnel magnetoresistive effect element as claimed in claim 7, wherein said metal oxide material is magnesium oxide.

9. The tunnel magnetoresistive effect element as claimed in claim 1, wherein said first and second crystalline insulation layers have a total thickness in a range from 0.4 nm to 0.9 nm.

10. The tunnel magnetoresistive effect element as claimed in claim 1, wherein said tunnel barrier layer has a thickness in a range from 0.9 nm to 2.4 nm.

11. A thin-film magnetic head with a tunnel magnetoresistive effect read head element including a lower electrode layer, a tunnel magnetoresistive effect multi-layer stacked on said lower electrode layer and provided with a tunnel barrier layer, and an upper electrode layer stacked on said tunnel magnetoresistive effect multi-layer,
said tunnel barrier layer of the tunnel magnetoresistive effect multi-layer comprising a three-layered structure of a first crystalline insulation layer, a crystalline semiconductor layer and a second crystalline insulation layer stacked in this order.

12. The thin-film magnetic head as claimed in claim 11, wherein said tunnel magnetoresistive effect multi-layer comprises a magnetization fixed layer, a magnetization free layer, and said tunnel barrier layer stacked between said magnetization fixed layer and said magnetization free layer.

13. The thin-film magnetic head as claimed in claim 12, wherein said magnetization fixed layer comprises a soft magnetic layer, and an anti-ferromagnetic layer exchange-coupled to said soft magnetic layer.

14. The thin-film magnetic head as claimed in claim 11, wherein said crystalline semiconductor layer is made of an oxide semiconductor material.

15. The thin-film magnetic head as claimed in claim 14, wherein said oxide semiconductor material is any one of zinc oxide, titanium oxide, chromium oxide, tantalum oxide, indium oxide, tin oxide and iron oxide, to which an impurity is added or not added.

16. The thin-film magnetic head as claimed in claim 11, wherein said crystalline semiconductor has a thickness in a range from 0.1 nm to 1.5 nm.

17. The thin-film magnetic head as claimed in claim 11, wherein said first crystalline insulation layer and said second crystalline insulation layer are made of a metal oxide material.

18. The thin-film magnetic head as claimed in claim 17, wherein said metal oxide material is magnesium oxide.

19. The thin-film magnetic head as claimed in claim 11, wherein said first and second crystalline insulation layers have a total thickness in a range from 0.4 nm to 0.9 nm.

20. The thin-film magnetic head as claimed in claim 11, wherein said tunnel barrier layer has a thickness in a range from 0.9 nm to 2.4 nm.

21. The thin-film magnetic head as claimed in claim 11, wherein an inductive write head element is formed on said upper electrode layer of said tunnel magnetoresistive effect read head element.

22. A magnetic disk drive apparatus including a magnetic disk, at least one thin-film magnetic head, and a support mechanism for supporting said at least one thin-film magnetic head so as to face a surface of said magnetic disk, said at least one thin-film magnetic head has a tunnel magnetoresistive effect head element including a lower electrode, a tunnel magnetoresistive effect multi-layer stacked on said lower electrode layer and provided with a tunnel barrier layer, and an upper electrode layer stacked on said tunnel magnetoresistive multi-layer, said tunnel barrier layer of said tunnel magnetoresistive effect layer comprising a three-layered structure of a first crystalline insulation layer, a crystalline semiconductor layer and a second crystalline insulation layer stacked in this order.

23. The magnetic disk drive apparatus as claimed in claim 22, wherein said crystalline semiconductor layer is made of an oxide semiconductor material.

24. The magnetic disk drive apparatus as claimed in claim 23, wherein said oxide semiconductor material is any one of zinc oxide, titanium oxide, chromium oxide, tantalum oxide, indium oxide, tin oxide and iron oxide, to which an impurity is added or not added.

25. The magnetic disk drive apparatus as claimed in claim 22, wherein said crystalline semiconductor layer has a thickness in a range from 0.1 nm to 1.5 nm.

26. The magnetic disk drive apparatus as claimed in claim 22, wherein said first crystalline insulation layer and said second crystalline insulation layer are made of a metal oxide material.

27. The magnetic disk drive apparatus as claimed in claim 26, wherein said metal oxide material is magnesium oxide.

28. The magnetic disk drive apparatus as claimed in claim 22, wherein said first and second crystalline insulation layers have a total thickness in a range from 0.4 nm to 0.9 nm.

29. The magnetic disk drive apparatus as claimed in claim 22, wherein said tunnel barrier layer has a thickness in a range from 0.9 nm to 2.4 nm.

\* \* \* \* \*